United States Patent [19]

Pavlin et al.

[11] Patent Number: 5,438,286

[45] Date of Patent: Aug. 1, 1995

[54] CIRCUIT FOR DETECTING AND OPEN LOAD

[75] Inventors: Antoine Pavlin, Puyricard; Jean-Louis Siaudeau, Belcodene, both of France

[73] Assignee: SGS-Thomson Microelectronics S.A., Gentilly, France

[21] Appl. No.: 138,849

[22] Filed: Oct. 19, 1993

[30] Foreign Application Priority Data

Oct. 21, 1992 [FR] France ............................ 92 12903

[51] Int. Cl.⁶ ..................... G05F 1/573; H02H 3/087
[52] U.S. Cl. ........................... 327/50; 327/535; 327/78; 327/63; 361/18; 361/42
[58] Field of Search .................. 361/103, 86, 58, 42, 361/18; 323/277, 279, 284; 327/535, 78, 63, 427, 362, 65, 108, 80, 82

[56] References Cited

U.S. PATENT DOCUMENTS

| | | | |
|---|---|---|---|
| 4,528,608 | 7/1985 | Andersson et al. | 361/18 |
| 5,004,970 | 4/1991 | Baron | 323/277 |
| 5,079,456 | 1/1992 | Kotowski et al. | 307/521 |
| 5,105,101 | 4/1992 | Hinooka | 302/355 |
| 5,187,632 | 2/1993 | Blessing | 361/103 |
| 5,220,207 | 6/1993 | Kovalcik et al. | 302/355 |
| 5,272,392 | 12/1993 | Wong et al. | 307/220 |

Primary Examiner—Timothy P. Callahan
Assistant Examiner—Dinh Le
Attorney, Agent, or Firm—Wolf, Greenfield & Sacks

[57] ABSTRACT

A circuit for the detection of an open load for a power MOS transistor is designed to operate in a switching mode. The MOS transistor is partitioned into two transistors disposed in parallel. The second transistor has a resistance in the conductive state higher than the first transistor. The circuit includes circuitry for enabling only the second transistor when the current is within a low value range, and circuitry for detecting an open load when the circuit is operating within the low current range.

19 Claims, 5 Drawing Sheets

CIRCUIT FOR DETECTING AND OPEN LOAD

BACKGROUND OF THE INVENTION

1. Field of the Invention

The present invention relates to a circuit for the detection of an open load for a vertical power MOS transistor, and more particularly relates to so-called "Smart Power" circuits that include on a single semi-conductor chip, one power MOS transistor and logic components.

2. Discussion of the Related Art

In the case of MOS transistors operating in switching mode (that is, in a cut off state or in a fully conductive state) and connected to a variable load, for example a load comprised of several loads in parallel, some of which are selectively selected, it is useful for the user to know whether a load is open. In this case, even if the power transistor is set conductive, it does not conduct any current.

It is also noted that a vertical power MOS (VDMOS) transistor includes numerous cells disposed in parallel and has a common drain terminal that is formed by the rear side of the silicon chip. On the other hand, the source or gate terminals, respectively, of the VDMOS transistors can be interconnected or connected by subgroups.

FIG. 1 schematically represents a conventional open load detection circuit. The drain of a power MOS transistor TP is connected to a high supply voltage terminal VCC and its source to a load L that has its second terminal connected to a low supply voltage terminal, generally to ground. A detection transistor TS, comprised of a small number of cells that are identical to the cells of the main transistor, is also connected by its drain to the supply terminal VCC. The source of transistor TS is connected to ground through a reference current source IREF. The gate of transistor TS is connected to the gate of transistor TP and is fed by a control voltage VG. The voltages VL and VS on the source terminals of transistors TP and TS are compared in a comparator C1 that provides an alarm signal OL when the source voltage of transistor TP becomes lower than the source voltage of transistor TS, that is, when current IL in the load becomes lower than a threshold current $IL_0$.

In a first approximation, considering that the power transistor TP includes $N_p$ cells (for example, 5,000 to 20,000) and that the detection transistor TS includes $N_s$ cells (for example, 10 to 25), the threshold current $IL_0$ is defined by the relation $$IL_0 = (N_p/N_s)IREF.$$

Thus, theoretically, if IREF is selected sufficiently low, the detection threshold can be very low. Indeed, it is generally desirable that this threshold be very low in order to differentiate the case when the charging current is low because the load has a high value from the case when the current is low, or zero because the load is open (disconnected or damaged).

In practice, comparator CI, that is integrated in the chip that contains the power component, may have a non-negligible offset voltage, for example, between −2 and +2 mV. This offset voltage is hereinafter referenced "Voff" Hence, the minimum value that can be reliably detected between the source voltages VL and VS of transistors TP and TS is:

$$VL - VS = Voff. \quad (1)$$

with IL being the current in the load, RonP, the resistance in the conductive state of the power transistor TP, and RonS, the resistance in the conductive state of the detection transistor TS, one can write $$VL = VCC - RonP.IL_0$$

$$VS = VCC - RonS.IREF.$$

Equation (1) is then:

$$-RonP.IL_0 + RonS.IREF = Voff \quad (2)$$

whereby $$IL_0 = (RonS/RonP)IREF - Voff/RonP$$

since $RonS/RonP = N_p/N_s$, the following equation is obtained:

$$IL_0 = (N_p/N_s)IREF - Voff/RonP. \quad (3)$$

It necessarily follows that $(N_p/N_s)IREF$ must be higher than $Voff/RonP$; therefore the lower limit of IL is:

$$IL_0 = 2Voff/RonP. \quad (4)$$

Thus, the minimum detection threshold is reversely proportional to the resistance value in the conductive state of the power MOS transistor TP. By way of example, if RonP=0.05 ohm and Voff=2 millivolts, the minimum current threshold $IL_0$ is 80 mA. Such a value is too high in numerous practical applications when it is desirable that this threshold be approximately 10 mA.

To solve this problem, circuits servocontrolling the gate voltage of a power MOS transistor with respect to the voltage drop across this transistor, through a linear regulation loop, are provided in the prior art. Such a method avoids some of the problems of the above described circuit because the detection threshold becomes independent of the resistance during the conductive state of the power MOS transistor and is very slightly sensitive to the offset voltage of a detection comparator. A problem with the above described method is the drawback associated with the provision of a more complex circuit and the drawback inherent in any linear regulation, i.e., a possible instability of the servo-control loop. Indeed, in the case of an inductive load, voltage oscillations in the load may occur during the switching on. Similarly, in the case of a capacitive load, the switching off of the load may cause the gate voltage to oscillate.

Thus, in order to provide a signal for detecting open loads, the prior art suggests either a solution such as the one shown in FIG. 1, that is simple and reliable but with unavoidably a relatively high detection threshold, or a solution that is relatively sensitive but complex and possibly unstable.

SUMMARY OF THE INVENTION

Accordingly, an object of the invention is to provide a circuit for the detection of an open load having a particularly low detection threshold.

Another object of the present invention is to provide such a circuit for the detection of an open load having a simple structure, without the risk of instability.

A further object of the present invention is to provide such a circuit for the detection of an open load that does not substantially modify the structure of a vertical power MOS transistor.

The present invention mainly provides to independently operate two groups of cells forming the power transistor, the cells being connected in parallel through their main terminals (drain and source) and separately connected through their control terminals (gate), and to set to conduction in series with the load only one group of these cells when the charging current is low. The resistance in the on state of the power transistor in this low current range is therefore higher and, as indicated by the above equation (4), the detection threshold can increase even if a comparator having an offset voltage varying within a relatively large range is used. It should be noted that the fact that only a limited number of cells of a power transistor is set to conduction during a low current phase is unimportant because, even if, in this case, the power transistor is more highly resistive, the current flowing therethrough is inherently low with a resulting low power dissipation.

More particularly, the present invention provides a circuit for the detection of an open load for a power MOS transistor designed to operate in a switching mode. The MOS transistor is partitioned into two transistors disposed in parallel, the second transistor having a resistance in the conductive state higher than the resistance of the first transistor. The circuit includes means to enable only the second transistor when the current is within a low value range, and means for the detection of an open load when the current is within this low value range.

In other words, the invention provides a circuit for the detection of an open load for a power MOS transistor designed to operate in the switching mode and formed by a large number of cells that are connected in parallel between a high supply voltage terminal and a low supply voltage terminal, in series with a load. In this circuit, the cells are partitioned into a first and a second group of cells, the control electrodes of the first group of cells being connected to a first control terminal, the control electrodes of the cells of the second group of cells being connected to a second control terminal, the number of cells included in the second group being smaller than the number of cells of the first group. Such a circuit includes means to inhibit the operation of the first group of cells when the current in the load is within a low value range, and means for detecting the flow of current below a predetermined threshold value that are active within the low current value range.

According to an embodiment of the invention, the means for detecting the flow of current occurring below a predetermined threshold value include a small number of cells similar to those of the power MOS transistor and that are connected between the high supply voltage and a current source that is connected to the low supply voltage terminal, and means for comparing the source voltage of the power transistor with the source voltage of the small number of cells.

According to an embodiment of the invention, the means for detecting the fact that the circuit operates within the first current range include a second small number of cells that are connected by their drain to the high supply voltage terminal and by their sources to a current source, and comparison means for comparing the source voltage of the cells of the main transistor with the source voltage of the second small number of cells.

The foregoing and other objects, features, aspects and advantages of the invention will become apparent from the following detailed description of the present invention when taken in conjunction with the accompanying drawings.

DETAILED DESCRIPTION

Figure 2:
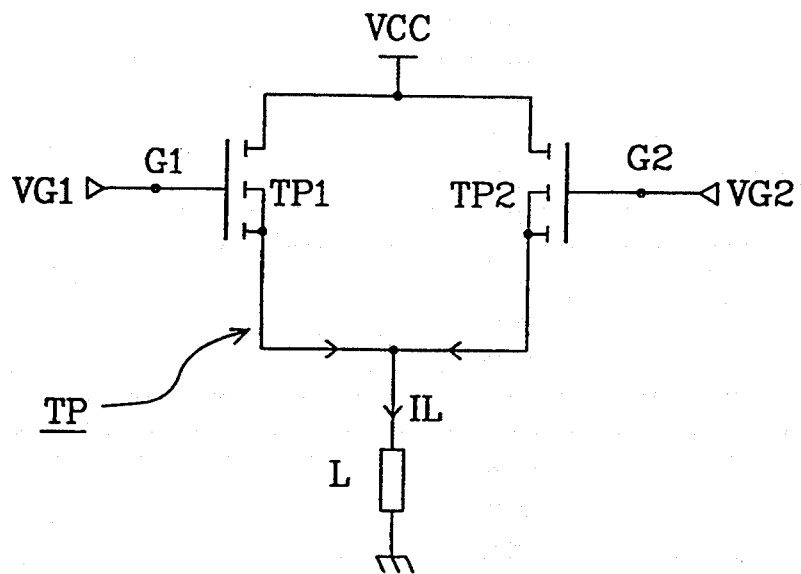
FIG. 2 represents a composite power transistor according to the invention.

As shown in FIG. 2, the present invention proposes the use of a main composite transistor TP comprised of two groups of cells having a common drain and a common source. The drain of transistor TP is connected to a high supply voltage terminal and its source to a load having its second terminal connected to a low supply voltage terminal, usually to ground. The gates of the cells of the first group, which are more numerous and form transistor TP1, are connected to a first control terminal G1. The gates of the second group of cells, which form transistor TP2, are connected to a control terminal G2. The control terminals G1 and G2 are independently operable. Preferably, one chooses for number N2 corresponding to the cells forming transistor TP2, a number that is 10 to 40 times smaller than number N1 corresponding to the cells forming transistor TP1, for example 15,000 to 20,000 cells for transistor TP1 and 500 to 2,000 cells for transistor TP2.

Figure 1:
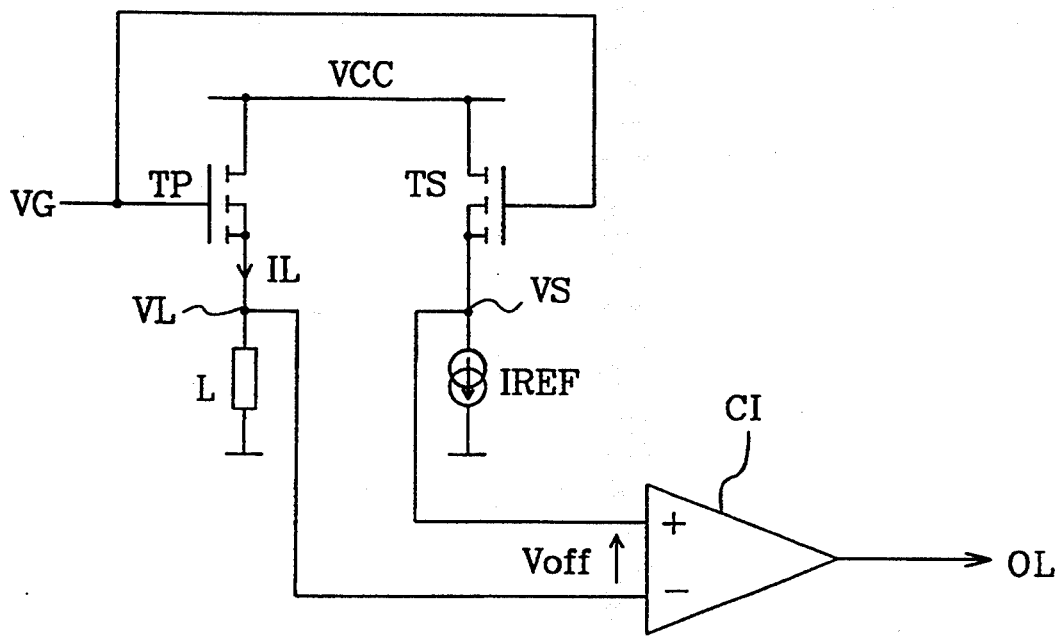
FIG. 1 schematically represents a circuit for the detection of an open load according to the prior art.

According to the invention, the composite transistor TP is controlled so that, within a first range of current, only transistor TP2 is turned on and, within a second range of current extending beyond the first range, both transistors TP1 and TP2 are turned on. The detection of an open load, i.e., the detection of a load current lower than a minimum value, is made in the same manner as in the example of FIG. 1. Then, necessarily, the circuit is within a low current range, that is, transistor TP2 only is conductive. The resistance during the conductive state of transistor TP2 is high with respect to the overall resistance of the composite transistor TP. Hence, it is possible to measure thresholds that are X times lower than in the example of the circuit of FIG. 1, the value of X being equal to the ratio between number N2 of cells forming transistor TP2 and number N1+N2 of cells forming the pair of transistors TP1 and TP2. With the exemplary values indicated above, it is therefore possible to reach threshold currents $IL_0$ that are 10 to 40 times lower than with circuits of the prior art for a power transistor substantially having an equal number of cells.

Figure 3:
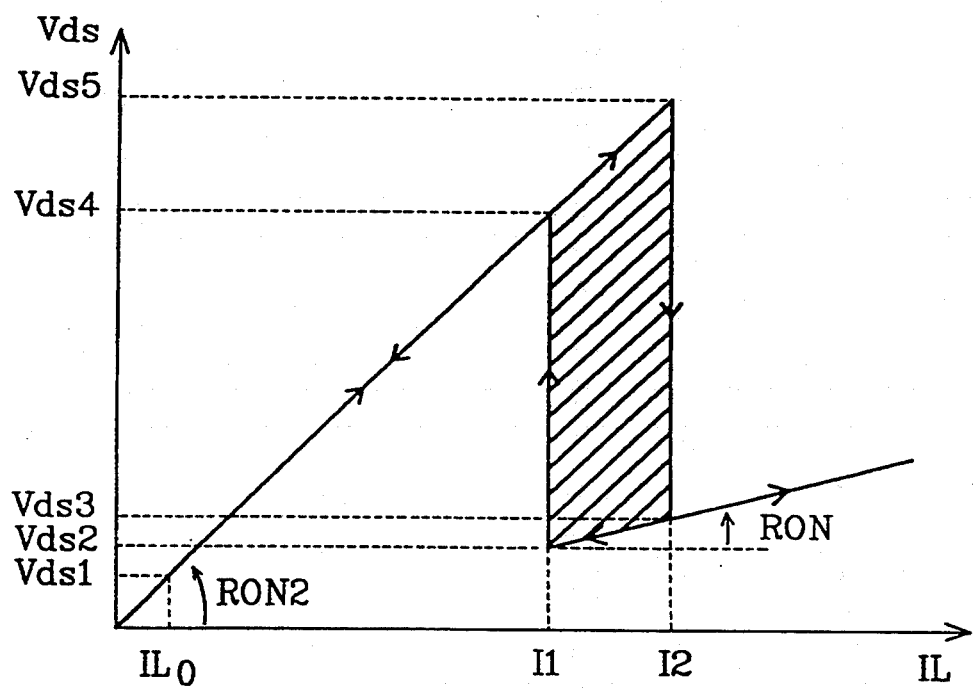
FIG. 3 illustrates the voltage-current characteristic curve of a composite power transistor according to the invention.

FIG. 3 illustrates the control mode of a transistor according to the invention, and represents the voltage Vds across the composite transistor as a function of the current in the load. At the switching on of the composite transistor TP, only transistor TP2 is turned on, which results in a voltage-current characteristic curve having a slope equal to Ron2. As soon as the current in the load reaches a value I2, the gate G1 of transistor TP1 is in turn controlled and transistor TP1 is also turned on. The voltage/current slope is then equal to Ron (resistance in the conductive state of transistor TP, comprised of transistors TP1 and TP2). If the current drops again below value I2, for a value of current I1 slightly lower than I2, the composite transistor TP is again switched to interrupt the conduction of transistor TP1; then, again, only transistor TP2 is conductive. If the current further decreases and drops below a value $IL_0$ such as defined by a comparator similar to the comparator of FIG. 1, the presence of an open load is indicated. In FIG. 3, Vds1 designates the drain-source voltage corresponding to current $IL_0$; Vds2 designates the voltage corresponding to current I1 and from which transistor TP1 stops conducting current; Vds3 designates the voltage from which transistor TP1 starts conducting current; Vds4 designates the voltage present when transistor TP1 has just stopped being conductive and transistor TP2 only is conductive; and Vds5 designates the voltage from which both transistors TP1 and TP2 are conductive. It should be noted that a value I1, lower than value I2 corresponding to the turning on of transistor TP1, has been selected for the turning off of transistor TP1, in order to avoid parasitic oscillations.

For the operation of the circuit according to the invention, means are provided to detect the fact that voltage Vds5 is reached by increasing values, voltage Vds2 is reached by decreasing values and voltage Vds1 is reached. Theoretically, three threshold comparator/detectors must be associated with the system according to the invention. However, in an exemplary practical embodiment as described below, only two comparators are used by selecting equal values for Vds1 and Vds2 and by providing logic circuits adapted to differentiate between the two transitions through I1 and $IL_0$.

Figure 4:
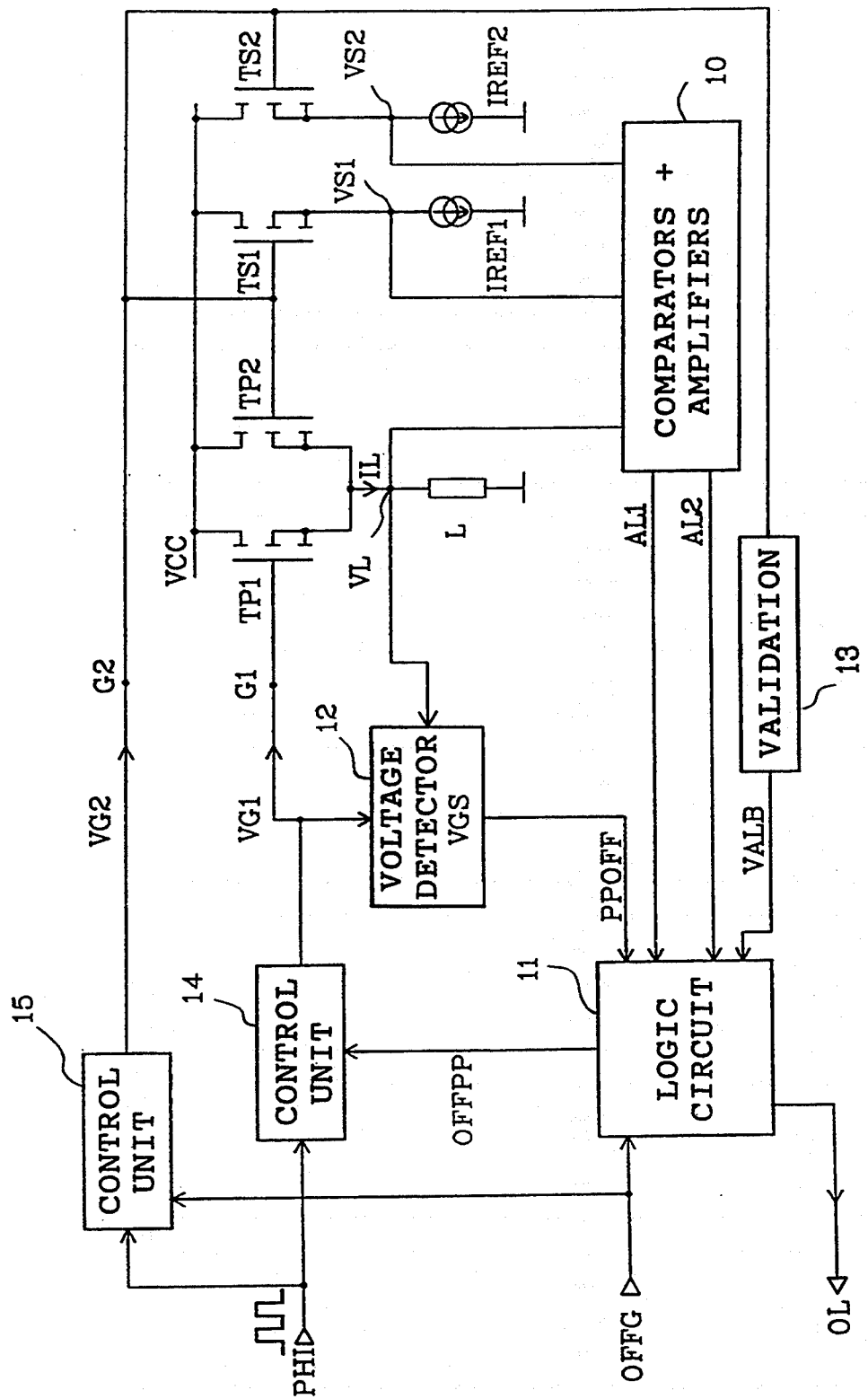
FIG. 4 represents an embodiment of a circuit according to the invention.

FIG. 4 is a block diagram of a composite transistor according to the invention associated with logic control and detection circuits.

FIG. 4 shows again transistors TP1 and TP2 having their drains connected to supply voltage VCC and their sources to a load L whose second terminal is connected to ground. Detection transistors TS1 and TS2, that are formed by a small number of cells identical to the cells of transistors TP1 and TP2, are connected by their drain to the high supply voltage VCC and by their source to ground through respective current sources IREF1 and IREF2. A comparator and amplifier module compares the voltage VL at the sources of the composite transistor TP1-TP2 with voltages VS1 and VS2 respectively present at the sources of the detection transistors TS1 and TS2. Module 10 provides alarm signals AL1 and AL2 to a logic circuit 11.

The alarm signal AL1 indicates that the current IL in the load is lower than threshold $IL_0$ when transistor TP2 alone is operating, or that current IL is lower than threshold I1 when the whole composite transistor is operating.

The signal AL2 indicates that the current IL is lower than threshold I2 when transistor TP2 alone is operating.

The signals AL1 and AL2 are provided to a logic circuit 11 that also receives a signal PPOFF from a detector 12 which detects the gate-source voltage of transistor TP1. The signal PPOFF indicates that the transistor TP1 is actually cut off. Additionally, there is provided an enabling module 13 operating at the switching-on to provide a signal VALB to the logic circuit 11. The logic circuit 11 also receives a general control signal OFFG and provides a signal OFFPP for inhibiting a control unit 14 of the gate G1 of the transistor TP1, and a signal OL indicative of an open load. The reference numeral 15 designates a control unit of the gate terminal G2 of transistors TP2, TS1 and TS2.

Assuming that a square-wave control signal, for example, arrives at gate control units 14 and 15, at the switching-on, when signal OFFG is transmitted, the control unit 15 provides a signal, clocked by the square waves, to transistors TP2, TS1 and TS2, while signal OFFPP inhibits the control unit 14. It is only once the signal AL2 has switched that signal OFFPP switches and that the control unit 14 turns on transistor TP1. Conversely, when the current decreases, the signal AL1 triggers in a first step the inhibition of the control unit 14 and, in a second step, the provision of signal OL.

Figure 5:
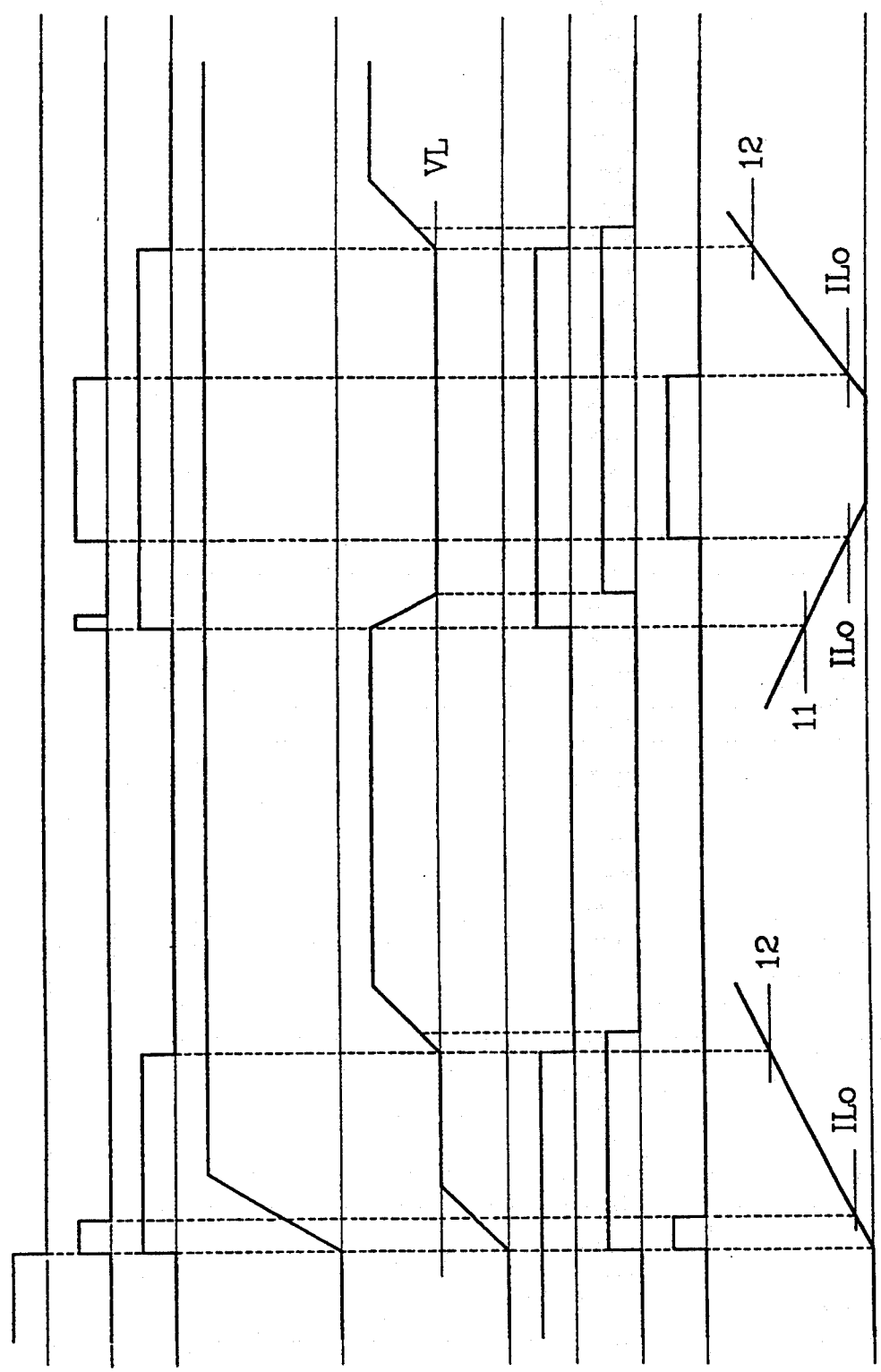
FIG. 5 is a timing diagram useful in illustrating the operation of a circuit according to the invention.

The waveforms of the various signals represented in the FIG. 5 are timing diagram in which the waveforms of the signals during the six successive operation phases are illustrated.

Phase 1: Normal switching-on of the circuit. When the component is turned on, signal OFFG drops to 0 thus allowing the triggering of transistor TP2 only, transistor TP1 remaining cut off by signal OFFPP that is active. Once transistor TP2 is controlled, the voltage (VG2) of its gate increases, causing the load current IL to start increasing. The alarm signal AL1 is active until current IL reaches and exceeds the threshold $IL_0$, signal OL is also active until threshold $IL_0$ is reached. Of course, the alarm signal AL2 is active because the current IL has not reached the threshold I2.

Phase 2: The load current IL continues increasing and exceeds the threshold I2; the alarm signal AL2 then drops to 0 causing transistor TP1 to start conducting because signal OFFPP drops to 0. The gate voltage of the transistor TP1, that had followed the load voltage VL (VL−2 forward diode voltage drops (Vf) in tills example) starts increasing, and when its voltage Vgs has become sufficiently positive, the signal PPOFF drops to 0, indicating that transistor TP1 is actually operating. The load current IL then flows through the pair of transistors TP1 and TP2.

Phase 3: It is the phase preceding the detection of an "open load" of the device in operation, both transistors TP1 and TP2 being operating. When the load current IL drops (disconnected load, . . . ) and drops below the threshold I1, the alarm signal AL1 becomes active. Immediately, the transistor TP1 is cut off by the signal OFFPP and the alarm signal AL2 becomes active because, when both transistors TP1 and TP2 are conductive, the alarm signal AL2 is purposely inhibited by a logic contrivance. Since the main transistor TP1 is cut off, its gate voltage VG1 drops; then, when VG1 becomes negative with respect to VL, the signal PPOFF is generated, indicating that transistor TP1 is actually cut off. The current through the load flows through the auxiliary transistor TP2 only. (The alarm signal AL1 drops to 0 because the whole load current (substantially equal to I1) flows through transistor TP2 since transistor TP1 is cut off).

Phase 4: The current in the load continues decreasing and, when the threshold $IL_0$ is reached, alarm signal AL1 becomes active again and an "open load" is detected, since signal OL becomes active.

Phase 5: Is equivalent to Phase 1, except for the fact that VG2 is already stabilized and that VG1=VL−2Vf (in this specific example).

Phase 6: Is similar to Phase 2.

Figure 6:
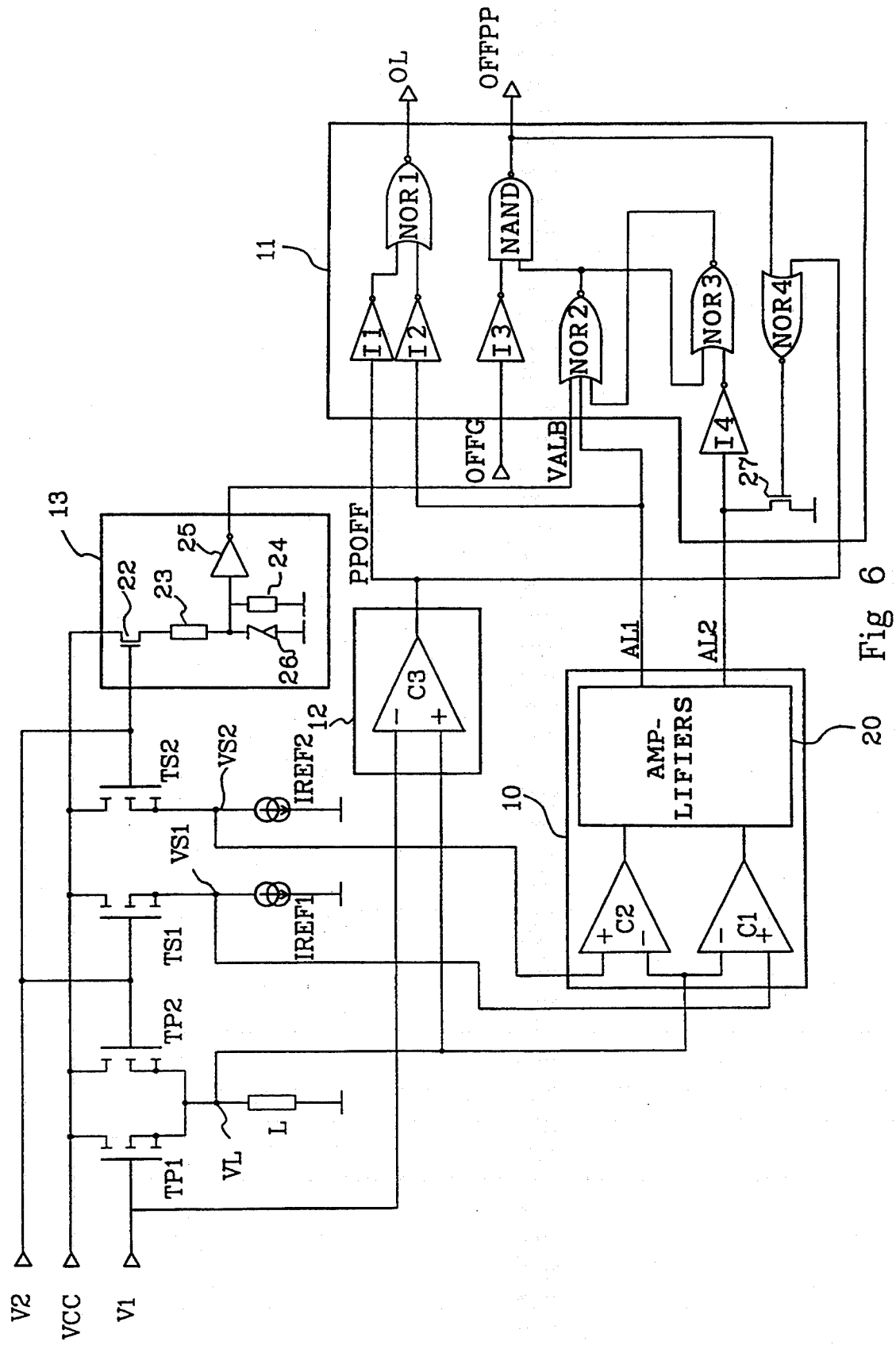
FIG. 6 represents in more detail logic circuits adapted to a circuit according to the invention.

FIG. 6 represents an exemplary practical embodiment of the block diagrams of FIG. 4. Similar blocks or elements are designated with the same reference numerals.

Block 10 includes two comparators C1 and C2 and respective amplifiers 20, designated for the sake of simplicity by a single block 20. The connections of the outputs AL1 and AL2 are crossed. Outputs AL1 and AL2 correspond to the output of comparator C1 and to the output of comparator C2, respectively. The comparator C1 compares voltage VL with voltage VS1, and comparator C2 compares voltage VL with voltage VS2. The detector 12 detecting the gate voltage of transistor TP1 compares the voltage VL with the voltage of gate G1 and provides the signal PPOFF. Thus, signals AL1 and AL2 are active if voltage VL is higher than voltages VS1 and VS2, respectively; the output PPOFF is active if voltage VL is higher than voltage VG1. The enabling block 13 includes a MOS transistor 22 disposed in series with respective resistors 23 and 24, the junction of resistors 23 and 24 being connected to an inverter 25. A protection zener diode 26 is disposed in parallel with resistor 24. The gate of transistor 22 is connected to terminal G2. Thus, as soon as a signal G2 is applied, the input of inverter 25 is set to 1 and its output VALB is set to 0.

The logic block 11 includes inverters I1-I4, NOR gates, NOR1-NOR4, and a NAND gate, as well as a MOS transistor 27. The connection of these various components is clearly shown in FIG. 6 and that should be considered as an integral part of the present description (although not described). The output of gate NOR1 provides the signal OL and the output of the NAND gate provides the signal OFFPP. The inverter I1 receives the signal PPOFF, the inverter I2 receives the signal AL1, the inverter I3 receives the signal OFFG, gate NOR2 receives the signals VALB and AL1 as well as the output of gate NOR3, the inverter I4 receives the signal AL2.

When the circuit is turned on, signal OFFG is set to 0 and signal VG2 is provided to the gate G2. Before signal VG2 has time to have an influence on the gates of the various transistors, the signal VALB is at whereby the gate NOR2 necessarily provides an output at 1, 0 and the NAND gate, whose second input is at 1, provides a signal at 1 that holds the turn off of transistor TP1. Then, as soon as the signal on terminal G2 increases, the signal VALB goes to 0 and the gate NOR2 can switch provided that its other inputs also go to 0. Therefore, as indicated, the function of the circuit 13 is only to set the initial cut off state of the transistor TP1.

Those skilled in the art will be capable of checking whether the logic circuit I1 ensures the desired functions. For example, in an initial phase, while the signal VG2 is applied, and while the voltage VL is still lower than VS1 and VS2 (IL is lower than $IL_0$), alarm signals AL1 and AL2 are at 1 and the outputs of the NOR1 and NAND gates are at 1. As soon as the voltage VL becomes higher than VS1, signal AL1 goes to 0 and the output of the gate NOR1 goes from 1 to 0, thus stopping the supply of signal OL. Then, when voltage VS2 is exceeded, signal AL2 goes to 0 and the output of the NAND gate also goes to 0, which causes interruption of the inhibition of transistor TP1. It can also be ascertained that the other desired operation phases of the circuit are satisfied by the logic circuit By way of example, the applicant has fabricated a component in which transistor TP1 includes 19,400 cells, transistor TP2 includes 745 cells, transistor TS7 includes 10 cells and transistor TS2 includes 2 cells.

The detailed circuit illustrated in FIG. 6 has been briefly described because it constitutes only one embodiment of the invention whose main aspects have been described above. Those skilled in the art will be able to make various modifications to the preferred embodiment of the circuit without departing from the spirit and scope of the invention.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A circuit for detecting an open load for a power MOS transistor designed to operate in a switching mode, wherein said MOS transistor includes first and second transistors disposed in parallel between a high voltage supply and a low voltage supply and in series with a load, the second transistor having a resistance in a conductive state higher than a resistance of the first transistor in a conductive state, the circuit comprising:
    means, coupled to the first and second transistors, for enabling conduction of only the second transistor when a current, drawn by the load, through the MOS transistor is below a first threshhold valve; and
    means, coupled to the means for enabling, for detecting an open load when only the second transistor is operating within a conductive state.

2. A circuit for detecting an open load for a power MOS transistor designed to operate in a switching mode and formed by a plurality of cells that are coupled between a high supply voltage-terminal and a low supply voltage terminal, and in series with a load, wherein the cells are partitioned into a first and a second group of cells, each group of cells having control electrodes, the control electrodes of the first group of cells being coupled to a first control terminal, the control electrodes of the second group of cells being connected to a second control terminal, a number of cells in the second group being smaller than a number of cells in the first group, the circuit comprising:
    means, coupled to the first and second group of cells, for inhibiting operation of the first group of cells when a current in the load is Within a predetermined value range; and
    means, coupled to the means for inhibiting, for detecting a current within the load lower than a predetermined threshold current value.

3. The circuit as claimed in claim 2 wherein the first group of cells is a first power transistor.

4. The circuit as claimed in claim 3 wherein the second group of cells is a second power transistor.

5. The circuit as claimed in claim 4 wherein the means for detecting includes a first detection transistor, coupled to the second power transistor, and a comparison circuit, coupled to the first detection transistor, for comparing a source voltage of the power MOS transistor with a source voltage of the first detection transistor.

6. The circuit as claimed in claim 5 wherein the means for detecting further includes a second detection transistor, coupled to the first detection transistor, and wherein the comparison circuit also compares the source voltage of the power MOS transistor with a source voltage of the second detection transistor.

7. The circuit as claimed in claim 6 wherein the first detection transistor includes a third group of cells, the cells being of a type substantially similar to a type of the cells of the power MOS transistor, coupled to the high supply voltage terminal and the low supply voltage terminal through a current source.

8. The circuit as claimed in claim 7 wherein the second detection transistor includes a fourth group of cells, the cells being of a type substantially similar to a type of the cells of the power MOS transistor, coupled to the high supply voltage terminal and the low supply voltage terminal through a current source.

9. The circuit as claimed in claim 8 wherein a number of cells in the third and fourth group of cells is less than a number of cells in the first and second group of cells.

10. The circuit as claimed in claim 9 wherein the second detection transistor has a source terminal and a drain terminal, the source terminal of the second detection transistor being coupled to the high supply voltage terminal, and the drain terminal of the second detection transistor being coupled to a current source.

11. A circuit for detecting an open load for a power transistor, the power transistor including first and second main transistors disposed in parallel between a high voltage supply terminal and a low voltage supply terminal and in series with a load, the circuit comprising:
control circuitry, coupled to the first and second main transistors, controlling operation of the first and second main transistors such that only the second main transistor is in a conductive state of operation when a current within the power transistor is within a predetermined value range; and
detection circuitry, coupled to the control circuitry, detecting a current within the power transistor below a predetermined threshold current value when only the second main transistor is within the conductive state of operation.

12. A circuit as claimed in claim 11 wherein the detection circuitry includes a first detection transistor, coupled to the second main transistor, and comparision circuitry, coupled to the first detection transistor, comparing a source voltage of the power transistor with a source voltage of the first detection transistor.

13. A circuit as claimed in claim 12 wherein the detection circuitry further includes a second detection transistor, coupled to the first detection transistor, and wherein the comparision circuitry also compares the source voltage of the power transistor with a source voltage of the second detection transistor.

14. A circuit as claimed in claim 13 wherein the first detection transistor is coupled between the high voltage supply terminal and the low voltage supply terminal through a current source.

15. A circuit as claimed in claim 14 wherein the second detection transistor is coupled between the high voltage supply terminal and the low voltage supply terminal through a current source.

16. A circuit as claimed in claim 15 wherein the comparison circuitry further includes a comparator and amplifier module, coupled to the power transistor and to the first and second detection transistors, comparing a source voltage of the power transistor with respective source voltages of the first and second detection transistors.

17. A method for detecting an open load for a power transistor including first and second main transistors, disposed in parallel between a high voltage supply terminal and a low voltage supply terminal and in series with a load, comprising the steps of:
enabling only the second main transistor into a conductive state of operation when a current within the power transistor is within a predetermined value range; and
detecting a current within the power transistor below a predetermined threshold current value when only the second main transistor is within the conductive state of operation.

18. A method as claimed in claim 17 wherein the step of enabling only the second main transistor into a conductive state of operation includes the step of disabling only the first main transistor out of the conductive state of operation.

19. A method as claimed in claim 18 wherein the step of detecting a current within the power transistor incudes the step of comparing a source voltage of the power transistor with source voltages of first and second detection transistors, coupled to the power transistor.

* * * * *